United States Patent
Jenks (10) Patent No.: US 9,723,730 B2
(45) Date of Patent: Aug. 1, 2017

(54) BEAM BAR SNAP IN AN ELECTRONIC DEVICE

(75) Inventor: Kenneth A. Jenks, Capitola, CA (US)

(73) Assignee: Apple Inc., Cupertino, CA (US)

( * ) Notice: Subject to any disclaimer, the term of this patent is extended or adjusted under 35 U.S.C. 154(b) by 1853 days.

(21) Appl. No.: 12/571,183

(22) Filed: Sep. 30, 2009

(65) Prior Publication Data

US 2011/0076091 A1    Mar. 31, 2011

(51) Int. Cl.
*H05K 5/00* (2006.01)
*H04M 1/02* (2006.01)

(52) U.S. Cl.
CPC ........ *H05K 5/0013* (2013.01); *H04M 1/0252* (2013.01); *Y10T 29/49876* (2015.01); *Y10T 403/18* (2015.01)

(58) Field of Classification Search
CPC ........ E05B 65/006; E04F 15/02; E05C 19/06; H05K 5/0013; H04M 1/0252; Y10T 403/18; Y10T 29/49876
USPC ...... 292/1, 300, 80, 302, 303, DIG. 11, 253, 292/81, 84, 85–87, 89, 107, 209; 361/679.57, 679.58
See application file for complete search history.

(56) References Cited

U.S. PATENT DOCUMENTS

| | | | | |
|---|---|---|---|---|
| 1,742,712 A | * | 1/1930 | Martin | E05C 19/063 292/340 |
| 2,251,138 A | * | 7/1941 | Knight | B65D 45/22 292/128 |
| 4,198,084 A | * | 4/1980 | Trotta | E05B 65/0014 292/209 |
| 4,904,007 A | * | 2/1990 | Woodruff | E05B 65/102 292/341.15 |
| 5,634,675 A | * | 6/1997 | Mo | E05C 19/06 220/284 |
| 6,220,637 B1 | * | 4/2001 | Kierl | E05C 19/06 292/80 |
| 6,320,252 B1 | | 11/2001 | Potters et al. | |
| 6,660,427 B1 | * | 12/2003 | Hukill | 429/97 |
| 2006/0292439 A1 | * | 12/2006 | Zuo | 429/97 |
| 2009/0059485 A1 | | 3/2009 | Lynch et al. | |
| 2009/0059502 A1 | | 3/2009 | Filson et al. | |
| 2009/0067141 A1 | | 3/2009 | Dabov et al. | |
| 2010/0187836 A1 | * | 7/2010 | Mason | 292/95 |

FOREIGN PATENT DOCUMENTS

WO    2008061359 A1    5/2008

* cited by examiner

*Primary Examiner* — Kristina Fulton
*Assistant Examiner* — Nathan Cumar (57) ABSTRACT

This is directed to a hook and receiving element combination for securing components forming the shell of an electronic device. The receiving element can include a beam connected to the outer shell component and operative to deflect as the hook element approaches the receiving element. To limit deflections of the outer shell component, the beam can be restrained at opposing ends in directions perpendicular to the beam length, but free to slide along the beam axis. In some embodiments, the receiving element can include a lip for guiding the deflection of the beam as the beam contacts the hook element. In particular, the lip can ensure that the beam deflects at an angle relative to the hook element motion such that a smaller hook element motion is required to engage the beam.

20 Claims, 8 Drawing Sheets

BEAM BAR SNAP IN AN ELECTRONIC DEVICE

BACKGROUND OF THE INVENTION

This is directed to a beam bar snapping mechanism for coupling components of a handheld electronic device. In particular, this is directed to a beam bar snap for coupling an electronic device bezel to an electronic device housing.

A portable electronic device can include several components defining the outer shell of the device. For example, the electronic device can include a housing that is coupled to a bezel substantially forming the external surfaces of the device. Each of the housing and bezel can be coupled to secondary components as part of the outer shell. For example, the housing can include a plastic cover positioned adjacent to an antenna, and the bezel can be coupled to a glass window under which display circuitry is provided.

The components forming the outer shell of the device can be connected using any suitable approach. In some embodiments, secondary components can be incorporated between the outer shell components in the assembly. For example, a spring element can be used to connect engaging members of a bezel and of a housing. In some embodiments, one of the components of the outer shell can include an engaging member operative to engage a corresponding member or element of the other outer shell component. For example, a bezel can include a hook for engaging a corresponding recess or notch in a housing.

SUMMARY OF THE INVENTION

This is directed to deflecting beam bar for receiving a snap to engage outer shell components of an electronic device. In particular, this is directed to a beam bar coupled to a device housing for receiving a hook extending from a bezel that engages the device housing.

The outer shell of an electronic device can be formed by engaging a bezel with a housing. The bezel and housing can include complimentary elements (e.g., a hook element and a receiving element) such that a hook element of one engages a receiving element of the other. The hook element can be constructed in any suitable manner, including for example as an offshoot or hook extending from a post connected to the surface of the bezel or housing.

The receiving element can be constructed from any suitable element operative to receive the offshoot of the hook element. To limit or reduce the stress on the outer shell component, the receiving element can include a beam connected to the outer shell component and operative to deflect as the hook element approaches the receiving element. For example, the beam can be restrained at opposing ends in directions perpendicular to the beam length, but free to slide along the beam axis to ensure that the only the beam deflects, and not the portions of the outer shell element restraining the beam.

The portions of the receiving element restraining the beam deflection can include several features for guiding the hook element as it engages the receiving element. In one embodiment, the receiving element can include a lip for guiding the deflection of the beam as the beam contacts the hook element. In particular, the lip can ensure that the beam deflects substantially perpendicular or at an angle to the hook element motion such that a smaller hook element motion is required to engage the beam.

To assist in servicing the electronic device, the hook element and receiving element can be tuned to define the particular force at which the hook element releases the receiving element. In addition, the number and position of the hook elements and receiving elements can be tuned based on the desired retaining force for the device. In one implementation, the engaging force can be selected such that the outer shell components can be removed using a suction-applied force.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

An electronic device can include an outer shell in which electronic device components can be secured and protected. The outer shell can be constructed from several components that engage one another using complimentary engaging elements. For example, an outer shell can include a bezel having a hook element that engages a fastening element of a housing. The fastening element can include any suitable feature for engaging the hook element, including for example a deflecting beam bar that is coupled to the housing. The beam bar can be constrained within a retaining element such that the beam bar deflects without causing the housing to deflect.

Figure 1:
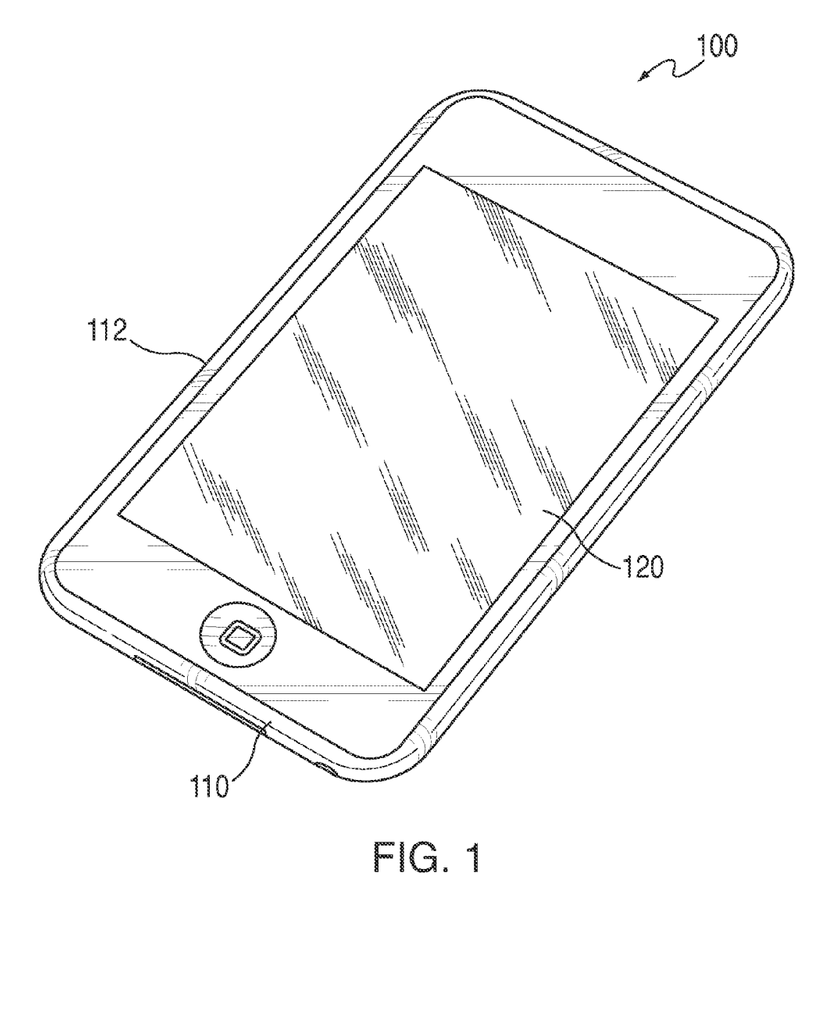
FIG. 1 is a schematic view of an illustrative electronic device in accordance with one embodiment of the invention.

FIG. 1 is a schematic view of an electronic device in accordance with one embodiment of the invention. Electronic device 100 can include housing 110, bezel 112, and window 120. Bezel 112 can be coupled to housing 110 in a manner to secure window 120 to the bezel. Housing 110 and bezel 112 can be constructed from any suitable material, including for example plastic, metal, or a composite material. In one implementation, housing 110 can be constructed from plastic or aluminum, and bezel 112 can be constructed from stainless steel. Window 120 can be constructed from any suitable transparent or translucent material, including for example glass or plastic. Different electronic device components can be retained within electronic device 100 to provide different functionality to the user.

Figure 2:
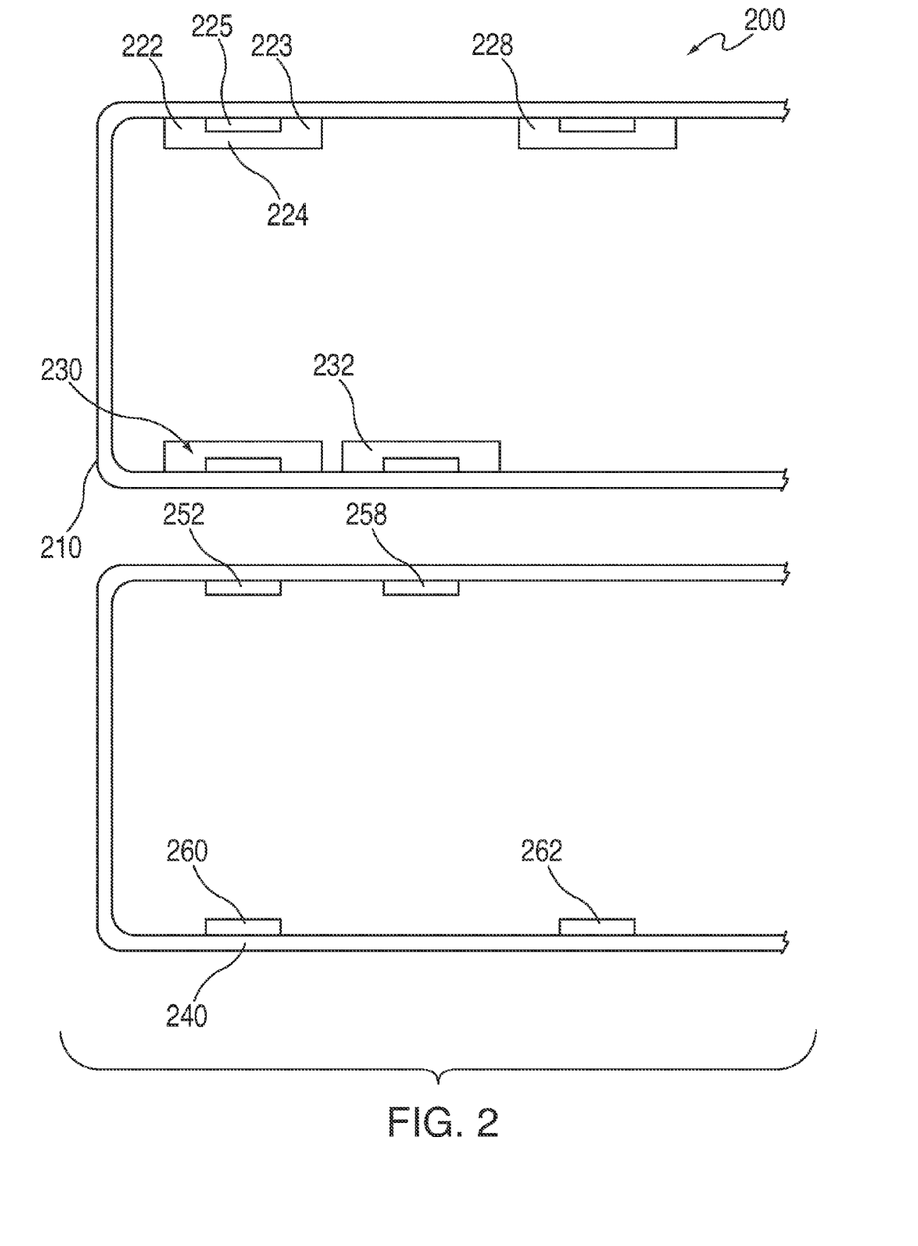
FIG. 2 is a top of view an illustrative bezel and housing forming an electronic device outer shell in accordance with one embodiment of the invention.

The housing and bezel can be coupled using any suitable approach. In some embodiments, the housing and bezel can include one or more complimentary features for engaging the bezel to the housing. FIG. 2 is a top of view an illustrative bezel and housing forming an electronic device outer shell in accordance with one embodiment of the invention. Housing 210 and bezel 240 can have any suitable shape or dimension, including for example shapes determined by an industrial design department. For example, the housing and bezel can have rounded shapes and be finished to provide an aesthetically pleasing device. The portions of housing 210 and bezel 240 that come into contact can be sized or finished such that the interface between the housing and bezel are seamless. In particular, the housing and bezel can be constructed such that a user passing a finger over the interface cannot or substantially cannot detect the interface.

Housing 210 can engage bezel 240 using any suitable approach. In some embodiments, housing 210 and bezel 240 can include complimentary elements extending from the housing and bezel and operative to engage. For example, housing 210 can include receiving elements 222, 228, 230 and 232, and bezel 240 can include complimentary hook elements 252, 258, 260 and 262 operative to engage the respective receiving elements. Receiving elements 222, 228, 230 and 232 can be substantially identical or instead only include few common features. Receiving element 222 can include retaining element 223 to which beam bar 224 is coupled to form opening 225. To ensure that a hook element can engage beam bar 224, receiving element can include free space between beam bar 224 and the bottom surface of housing 210. Retaining element 223 can be integrated with housing 210 using any suitable approach. In some embodiments, retaining element 223 can include a distinct component coupled to the housing (e.g., using an adhesive, solder, welding, heat staking, or a mechanical fastener). Alternatively, retaining element can be manufactured within housing 210 (e.g., using molding, machining, or casting). Beam bar 224 can be coupled to retaining element 224 such that the beam bar can deflect when a hook element engages the receiving element. In particular, beam bar 224 can be secured at only one end to ensure that the beam can easily deflect. The size (e.g., length and diameter or cross-section) and material used for the beam can be selected or tuned based on a desired retention force for housing 210 and bezel 240. Receiving element 228, 230 and 232 can include some or all of the described features of receiving element 222.

Hook elements 252, 258, 260 and 262 can include posts from which hook elements extend. The posts can be sized such that at least a portion of each post extends into the opening of a complimentary receiving element (e.g., opening 224). The hook elements can be sized and positioned along the posts such that the hook elements can extend below a beam bar (e.g., beam bar 223) and engage the beam bar. This can ensure that each hook element properly engages a corresponding receiving element.

The hook elements and corresponding receiving elements can be positioned at any suitable location in the enclosure components. In some embodiments, the hook and receiving elements can be positioned such that the enclosure bezel can be coupled to the enclosure housing in only a single orientation. In particular, the receiving elements can be positioned asymmetrically. In the particular example of FIG. 2, receiving elements 230 and 232 are placed adjacent to one another along an edge of housing 210, which bezel 240 includes corresponding hook elements 252 and 258 also placed adjacent to one another on the opposite edge of the bezel. Receiving elements 222 and 228, and hook elements 260 and 262 are positioned apart from one another, but such that receiving elements 222 and 230, and hook elements 252 and 260 are substantially aligned within the respective housing and bezel. This can ensure that receiving elements 258 and 262, and hook elements 228 and 232 are asymmetrical, and would not engage complimentary elements should bezel 240 be placed upside down over housing 210.

Although the implementation of FIG. 2 has receiving and hook elements on opposite sides or ends of the enclosure elements, the receiving and hook elements can be distributed along the enclosure elements in any suitable manner. In some embodiments, only a single receiving and hook element can be used, or receiving and hook elements of different sizes can be used. Alternatively, one or more hook and receiving elements can be used on one or more sides of the bezel and housing. For example, one or more receiving or hook elements can be used on opposite sides, adjacent sides, or combinations of these of the housing and bezel. In addition, one or more of the housing and bezel can be modulable and used with other types of housings and bezels to form different device enclosures. To ensure that a single housing or bezel and be used in a variety of products, the housing or bezel can include receiving or hook elements that are not used in every device enclosure (e.g., an extra receiving element in a housing that is used with a first type of bezel but not with a second type of bezel.

Figure 3:
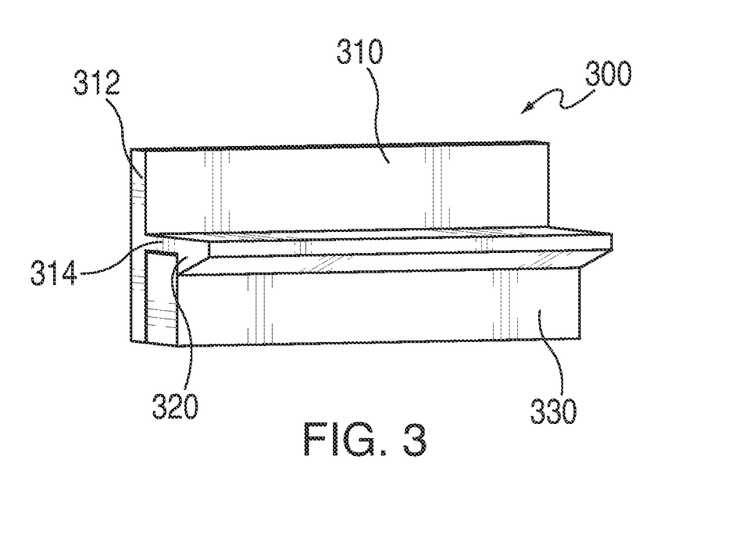
FIG. 3 is a perspective view of a typical hook element engaged to a receiving element.
Figure 4:
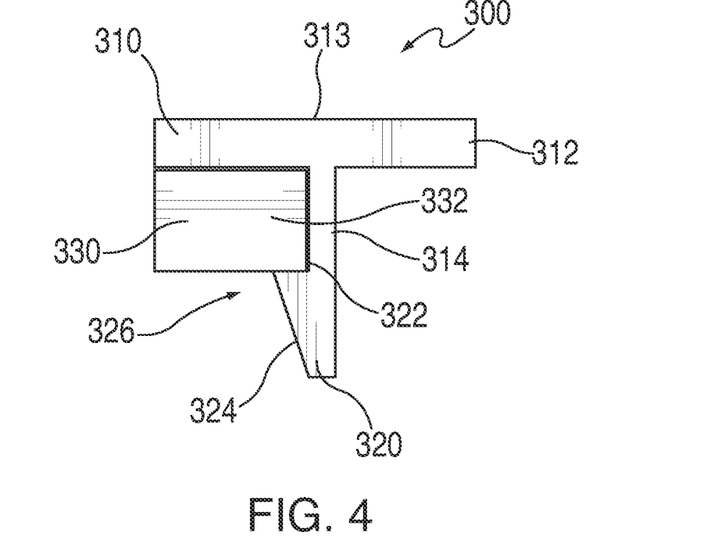
FIG. 4 is a cross-sectional view of the engaged hook and receiving elements of FIG. 3.

The hook and receiving elements can have any suitable configuration. FIG. 3 is a perspective view of a typical hook element engaged to a receiving element. FIG. 4 is a cross-sectional view of the engaged hook and receiving elements of FIG. 3. Assembly 300 can include hook element 310 engaged with receiving element 330. Hook element 310 can include body 312 from which post 314 can extend. Post 314 can include a discrete protrusion or wall or other extended post. Post 314 can have any suitable dimension or cross section, including for example a smaller cross section than body 312 so that post 314 can deflect when positioned over receiving element 330. Post 314 can extend from body 312 at any suitable angle, including for example at substantially an orthogonal angle, or at an angle set by constraints of the device enclosure (e.g., at an angle to fit particular device components within the enclosure).

To engage an edge of receiving element 330, hook element 310 can include angled protrusion 320 defining recess 322 into which receiving element 330 can fit. Protrusion 320 can include bevel or chamfered edge 324 culminating in point 326 for guiding receiving element 330 past protrusion 320 and into recess 322. The length and angle of edge 324 can be selected based on any suitable criteria, including for example the required force and displacement to engage hook element 310 with receiving element 330, and the retaining force of the hook element (e.g., the force required to disengage hook element 310 from receiving element 330).

Receiving element 330 can include exposed edge 332 sized to be received within recess 322 and to engage protrusion 320. In some embodiments, receiving element 330 can be incorporated within the device housing or bezel (e.g., as an internal feature within the enclosure element). In the particular design described in FIGS. 3 and 4, receiving element 330 is substantially fixed and hook element 310 deflects as the hook and receiving elements engage. This may put stress on post 314, as well as on interface 313 between body 312 and post 314. In addition, the deflection of post 314 can cause damage or deflection in the bezel or housing in which hook element 310 is constructed, which can further detract from the aesthetic appeal of the device enclosure. To ensure that hook element 310 does not fail, interface 313 may be reinforced, which in turn can increase manufacturing complexity and cost. An alternative approach in which another component deflects without affecting the external enclosure elements may then be desirable.

Figure 5:
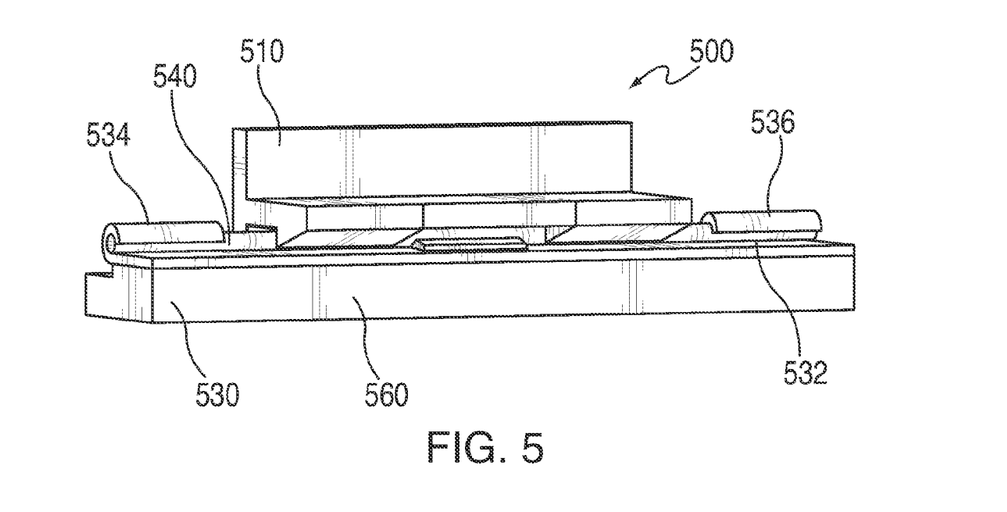
FIG. 5 is a perspective view of an illustrative hook element and receiving element engagement in accordance with one embodiment of the invention.

FIG. 5 is a perspective view of an illustrative hook element and receiving element engagement in accordance with one embodiment of the invention. Device 500 can include hook element 510 engaged to receiving element 530. Hook element 510 can include some or all of the features of hook element 310 described above. In some embodiments, hook element 510 can be incorporated in or connected to an interior surface of a device enclosure element (e.g., built into a bezel or housing). Receiving element 530 can be coupled to device enclosure element 560 using any suitable approach, including for example by welding, an adhesive, a fastener, or another approach.

Receiving element 530 can include base 532 used to connect receiving element 530 to enclosure element 560. Base 532 can define a substantially planar element from which coupling ends 534 and 536 extend. Coupling ends 534 and 536 can include any suitable feature extending from the surface of base 532 for receiving and retaining beam bar 540. In particular, coupling ends 534 and 536 can be positioned at opposite ends of base 532 and offset from the surface of the base such that beam bar 540 can deflect without being constrained by base 532.

Beam bar 540 can be constrained between coupling ends 534 and 536 such that beam bar 540 can bend or deflect without causing base 532 to deflect. In particular, beam bar 540 can be secured to only one of coupling ends 534 and 536 such that beam bar 540 can deflect and move laterally within the other of the coupling ends. For example, beam bar 540 can be constrained to move laterally within a tube formed by one of coupling ends 534 and 536. As another example, beam bar 540 can be constrained to move laterally within tubes of both coupling ends 534 and 536, where the coupling ends limit the lateral travel of the beam bar to ensure that it remains within the coupling ends.

Figure 6:
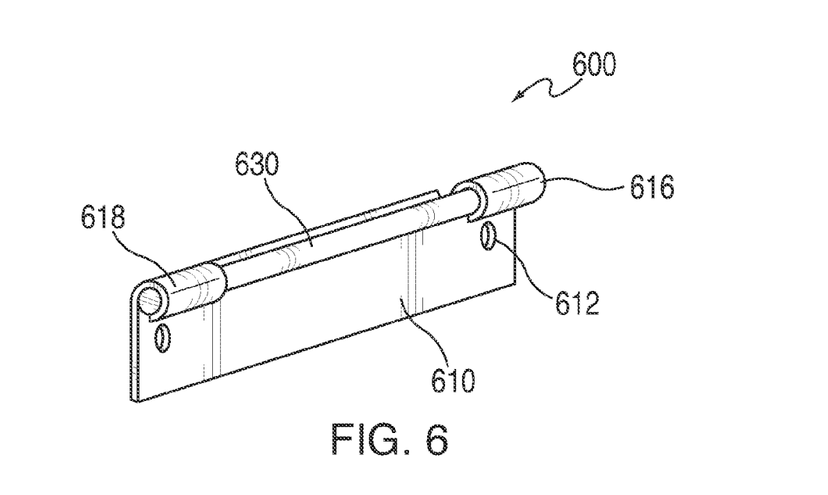
FIG. 6 is a schematic view of an illustrative receiving element for use with a hook element in accordance with one embodiment of the invention.
Figure 7:
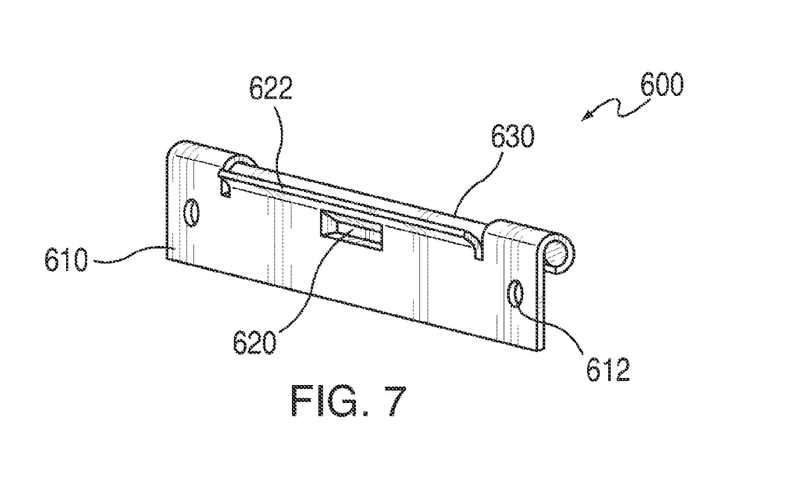
FIG. 7 is a schematic view of another perspective of the receiving element of FIG. 6 in accordance with one embodiment of the invention
Figure 8:
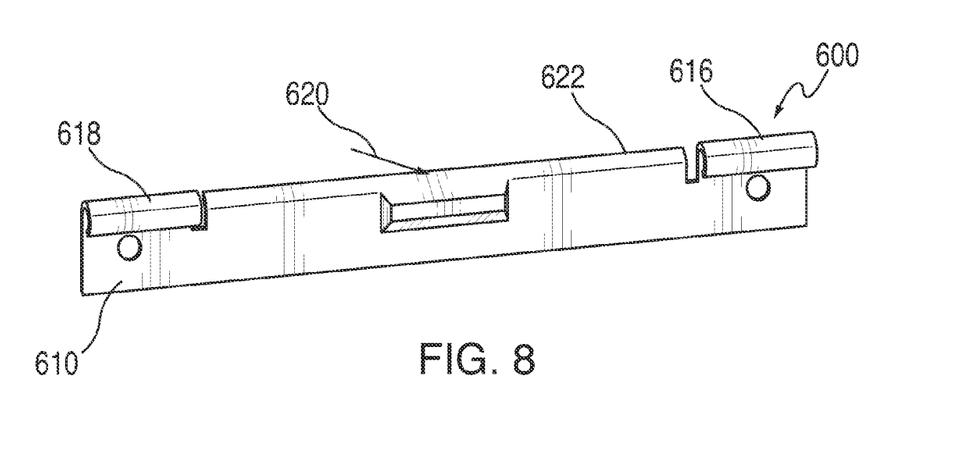
FIG. 8 is a schematic view of the receiving element base of the illustrative receiving element of FIG. 6 in accordance with one embodiment of the invention.

FIG. 6 is a schematic view of an illustrative receiving element for use with a hook element in accordance with one embodiment of the invention. FIG. 7 is a schematic view of another perspective of the receiving element of FIG. 6 in accordance with one embodiment of the invention. FIG. 8 is a schematic view of the receiving element base of the illustrative receiving element of FIG. 6 in accordance with one embodiment of the invention. Receiving element 600 can include planar base 610 that can be coupled to an enclosure element using any suitable approach. For example, receiving element 600 can be coupled a housing wall via welding, an adhesive, a fastener (e.g., passing through opening 612), or any other suitable approach. Base 610 can include coupling elements 616 and 618 extending from opposite ends of base 610 and along an edge of base 610. In particular, coupling elements 616 and 618 can extend out of the plane of base 610 such that beam bar 630 is offset from base 610 (e.g., out of the plane of base 610). Coupling elements 616 and 618 can be constructed using any suitable approach, including for example by rolling material to create a tube along an edge of base 610 or coupling a tube to the edge of base 610.

Beam bar 630 can be placed between coupling elements 616 and 618 such that at least one end of beam bar 630 is free to be deflect laterally (e.g., along the edge of base 610, along the axis of the beam bar). For example, beam bar 630 can be fixed to one of coupling elements 616 and 618 (e.g., by crimping the coupling element, using an adhesive, or a press fit) but free to slide within the other coupling element. As another example, beam bar 630 can be placed within coupling elements 616 and 618 such that neither coupling element prevents the beam bar from moving along the beam bar axis, but coupling elements 616 and 618 can include ends caps that retain beam bar 630 between the coupling elements. In some embodiments, beam bar 630 can instead or in addition be constructed from two distinct beam elements each coupled to one of coupling elements 616 and 618, such that the two distinct beam elements meet in between the coupling elements (e.g., in the middle of base 610, for example adjacent to ramp 620).

Figure 13:
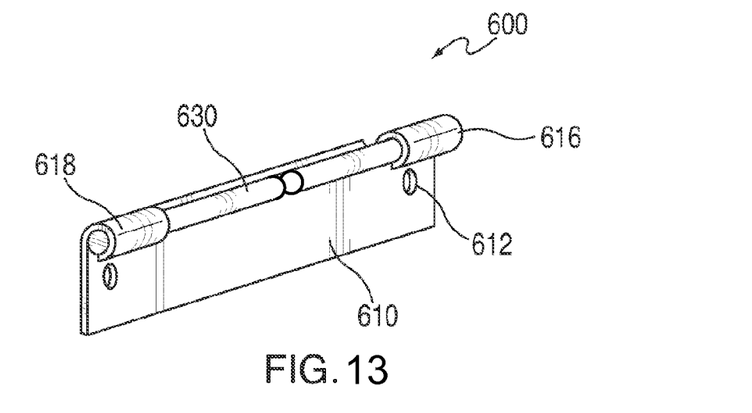
FIG. 13 is a schematic view of another illustrative example of a receiving element for use with a hook element.

Beam bar 630 can be placed between coupling elements 616 and 618 such that at least one end of beam bar 630 is free to be deflect laterally (e.g., along the edge of base 610, along the axis of the beam bar). For example, beam bar 630 can be fixed to one of coupling elements 616 and 618 (e.g., by crimping the coupling element, using an adhesive, or a press fit) but free to slide within the other coupling element. As another example, beam bar 630 can be placed within coupling elements 616 and 618 such that neither coupling element prevents the beam bar from moving along the beam bar axis, but coupling elements 616 and 618 can include ends caps that retain beam bar 630 between the coupling elements. In some embodiments (as illustrated in FIG. 13), beam bar 630 can instead or in addition be constructed from two distinct beam elements each coupled to one of coupling elements 616 and 618, such that the two distinct beam elements meet in between the coupling elements (e.g., in the middle of base 610, for example adjacent to ramp 620).

Figure 9:
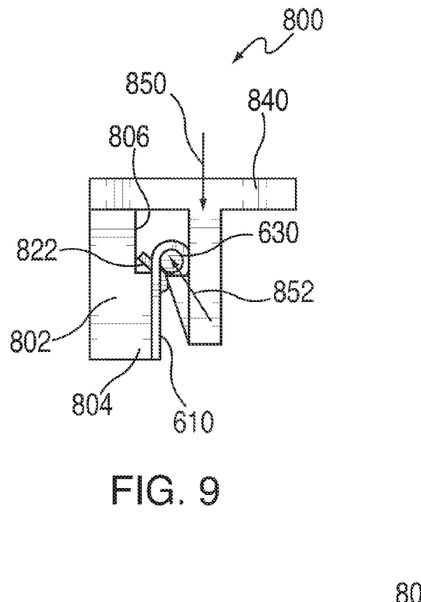
FIG. 9 is a cross-sectional view of the illustrative receiving element of FIG. 6 when engaging a hook element in accordance with one embodiment of the invention.
Figure 10:
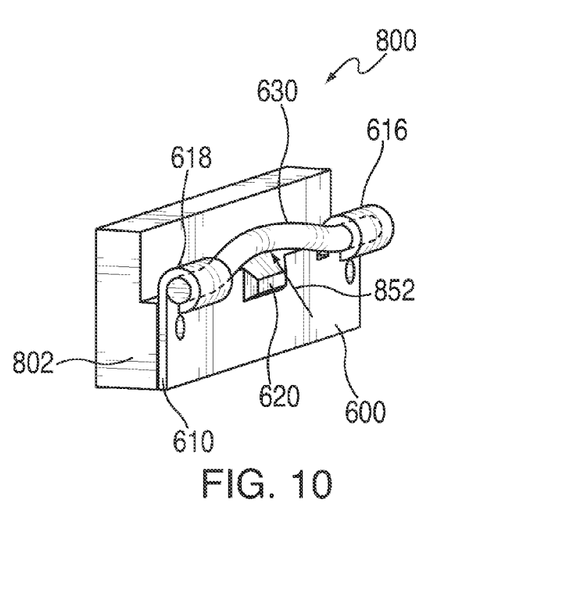
FIG. 10 is a perspective view of the illustrative receiving element of FIG. 6 coupled to an enclosure element in accordance with one embodiment of the invention.
Figure 11:
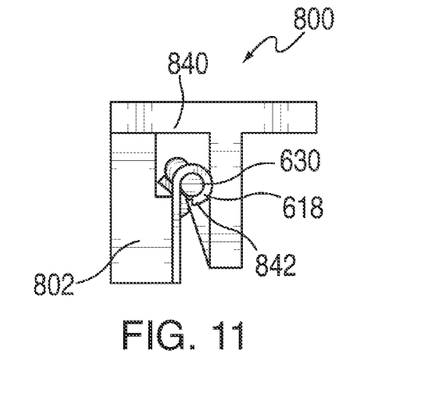
FIG. 11 is a cross-sectional view of the illustrative receiving element of FIG. 6 when engaged to a hook element in accordance with one embodiment of the invention.

When a hook element is placed over receiving element 600, the hook element can cause beam bar 630 to deflect to engage the hook element. FIG. 9 is a cross-sectional view of the illustrative receiving element of FIG. 6 when engaging a hook element in accordance with one embodiment of the invention. FIG. 10 is a perspective view of the illustrative receiving element of FIG. 6 coupled to an enclosure element in accordance with one embodiment of the invention. FIG. 11 is a cross-sectional view of the illustrative receiving element of FIG. 6 when engaged to a hook element in accordance with one embodiment of the invention. To guide the deflection of beam bar 630, receiving element 600 can include ramp 620 and chamfered wall 622 along the edge or side of base 610 that is adjacent to beam bar 630. Ramp 620 can include a chamfered surface extending from the surface of base 610 towards beam bar 630 (e.g., extending in the same direction as coupling elements 616 and 618) such that when beam bar 630 is deflected by hook element 840, beam bar 630 is redirected by ramp 620. Chamfered wall 622 can be angled such that it is a continuation of ramp 620. In particular, as hook element 840 moves into receiving element 610 in the direction indicated by arrow 850, beam bar 630 can be deflected into ramp 620 by protrusion 842 of hook element 840. Beam bar 630 can deflect away from protrusion 842 in a direction that is substantially not parallel to the direction of arrow 850, for example in the direction indicated by arrow 852, in a direction substantially orthogonal to the direction of arrow 852, or any other non-parallel direction.

The length and angle of ramp 620 can be selected based on any suitable approach. In some embodiments, the ramp characteristics can be selected such that beam bar 630 deflects in a particular direction (e.g., at a substantially large angle relative to the motion of the hook element), or deflects by a particular amount. In some cases, the size and angle of protrusion 842 of hook element 840 can be tuned along with the characteristics of ramp 620 to define a particular displacement and angle of displacement of beam bar 630.

Once protrusion 842 of hook element 840 passes beam bar 630, no force may be applied to deflect beam bar along ramp 620, and beam bar 630 may elastically return to its initial position. Beam bar 630, however, may then engage a recession of hook element 840 (e.g., similar to the implementation described in FIGS. 3 and 4). This approach therefore ensures that the hook element can engage the receiving element without any or significant stresses being exerted on the device enclosure. In particular, enclosure element 802 may not deflect at all, as beam bar 630 alone deflects and moves laterally as a result of the deflecting within base 610.

In some embodiments, enclosure element 802, to which receiving element 600 is coupled, can include one or more features for allowing beam bar 630 to deflect upon insertion of hook element 840 in receiving element 600. In one implementation, enclosure element 802 can include extension 804 or depression 806 for supporting receiving element 600. In particular, receiving element 600 can be coupled to extension 804 such that depression 806 is located adjacent to ramp 620 and chamfer 622, which can provide space into which beam bar 630 can deflect. In some cases, enclosure element 802 can include only one of extension 804 and depression 806.

In some embodiments, receiving element can have other configurations for retaining a beam bar within an enclosure element such that a corresponding hook element can engage the beam bar. For example, the receiving element can include two posts extending substantially perpendicular from an inner surface of the enclosure element and retaining a beam bar between the two posts. The posts can retain the beam bar such that the beam bar can be displaced laterally as it bends. It will be understood, however that any other supporting structure for retaining a beam bar while allowing lateral displacement can be used for the receiving element.

Figure 12:
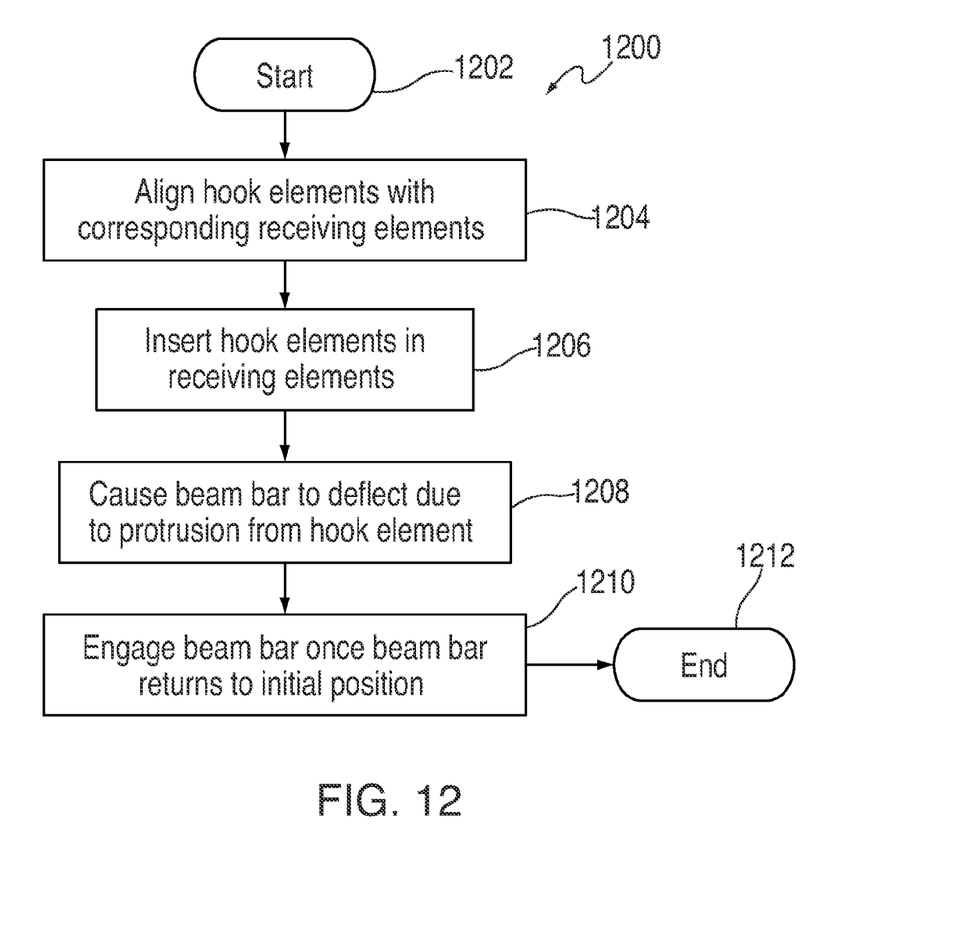
FIG. 12 is a flowchart of an illustrative process for engaging hook and receiving elements in accordance with one embodiment of the invention.

FIG. 12 is a flowchart of an illustrative process for engaging hook and receiving elements in accordance with one embodiment of the invention. Process 1200 can begin at step 1202. At step 1204, hook elements used to couple electronic device shell elements can be aligned with counterpart or corresponding receiving elements in an opposing shell device. For example, the hook elements embedded in or coupled to a device bezel can be positioned and aligned opposite receiving elements of a device housing. At step 1206, the hook elements can be inserted in the receiving elements. For example, a tip of each hook element can be placed within an opening of a corresponding receiving element. At step 1208, as the tip of the hook element engages the receiving element, the tip can contact a beam bar within the receiving element and cause the beam bar to deflect. In particular, the beam bar can deflect away from the hook element in a direction angled away from the direction of motion of the hook element, for example guided by a ramp within the receiving element. At step 1210, the hook elements can engage the complimentary receiving elements to secure the device shell components to each other. For example, the hook elements can be inserted into the receiving elements such that the beam bar returns to its initial position and a protrusion of the hook element engages the beam bar. Process 1200 can then end at step 1212.

The previously described embodiments are presented for purposes of illustration and not of limitation. It is understood that one or more features of an embodiment can be combined with one or more features of another embodiment to provide systems and/or methods without deviating from the spirit and scope of the invention. The present invention is limited only by the claims which follow.

What is claimed is:

1. A system for coupling first and second electronic device outer shell elements, comprising:
   a first outer shell element comprising:
      a post extending from a surface of the outer shell element; and
      a protrusion extending from the post, the protrusion defining a recess; and
   a second outer shell element comprising:
      a base coupled to a surface of the second outer shell element;
      at least two coupling elements directly extending from an edge of the base, the at least two coupling elements formed from the edge of the base; and
      a beam bar constrained by the at least two coupling elements, wherein the beam bar is operative to deflect as the protrusion passes by the beam bar when the post is inserted adjacent to the base.

2. The system of claim 1, wherein the second outer shell further comprises: a ramp operative to direct the deflection of the beam bar.

3. The system of claim 2, wherein: the ramp angle and size is selected based on a desired deflection of the beam bar.

4. The system of claim 2, wherein: the ramp constrains the beam bar to deflect at a substantially large angle relative to the movement of the movement of the protrusion within the device outer shell.

5. The system of claim 2, wherein: the ramp and at least two coupling elements extend from a common edge of the base.

6. The system of claim 1, wherein: the beam bar is secured in one of the at least two coupling elements to prevent the beam bar from moving laterally along a beam bar axis.

7. The system of claim 6, wherein: the beam bar is secured in the one of the at least two coupling elements by crimping the one of the at least two coupling elements around the beam bar.

8. The system of claim 6, wherein: the beam bar is free to move laterally along the beam bar axis in the remaining of the at least two coupling elements.

9. A receiving element used for coupling a bezel to a housing, comprising:
   a base plate;
   at least one coupling element directly extending from an edge of the base plate, the at least one coupling element formed from the edge of the base plate, the at least one coupling element extending out of the plane of the base plate; and
   a beam bar operative to deflect, the beam bar secured at within the at least one coupling element, wherein the beam bar is substantially parallel to the edge of the base plate and operative to bend towards the edge of the base plate.

10. The receiving element of claim 9, further comprising:
a chamfer along the edge of the base plate, the chamfer extending adjacent to the beam bar; and
a ramp extending from the plane of the base plate towards the beam bar, the ramp defining a chamfered edge operative to deflect the beam bar towards the chamfer.

11. The receiving element of claim 10, wherein: the chamfer and the ramp define a substantially continuous surface for directing the deflection of beam bar.

12. The receiving element of claim 9, further comprising: two coupling elements positioned along the edge of the base plate; and wherein the beam bar is constrained by the two coupling elements.

13. The receiving element of claim 12, wherein:
the beam bar is prevented from moving laterally in the direction of a beam bar axis by one of the two coupling elements; and
the beam bar is free to move laterally in the direction of the beam bar axis in the other of the two coupling elements.

14. The receiving element of claim 13, wherein: as the beam bar bends towards the edge of the plate, a portion of the beam bar moves laterally partially out of the other of the two coupling elements.

15. The receiving element of claim 9, wherein the at least one coupling element comprises first and second coupling elements positioned along the edge of the base plate and the beam bar comprises a first beam bar and a second beam bar wherein a first end of the first beam bar is secured within the first coupling element and
a first end of the second beam bar is secured within the second coupling element such that the free ends of the first and second beam bars extend towards the second and first coupling elements, respectively.

16. The receiving element of claim 15, wherein: the free ends of the first and second beam bars do not overlap.

17. A method for assembling an electronic device shell, comprising:
aligning a hook element extending from a bezel with a receiving element of a housing;
inserting the hook element within an opening in the receiving element;
causing a beam bar of the receiving element that is constrained by at least two coupling elements directly extending from an edge of the receiving element, the at least two coupling elements formed from the edge of the receiving element, to deflect due to contact with the hook element, wherein the direction of the beam bar deflection is in a direction substantially opposite the movement of the hook element as it is inserted; and
allowing the beam bar to return to its initial position to engage the hook element once the hook element has been sufficiently inserted within the receiving element.

18. The method of claim 17, further comprising: directing the deflection of the beam bar in the direction substantially opposite the movement of the hook element via a ramp built into the receiving element.

19. The method of claim 17, further comprising: causing at least one end of the beam bar to travel laterally along a beam bar axis.

20. The method of claim 17, further comprising: aligning a plurality of hook elements with a plurality of complimentary receiving elements.

* * * * *

UNITED STATES PATENT AND TRADEMARK OFFICE
CERTIFICATE OF CORRECTION

PATENT NO. : 9,723,730 B2
APPLICATION NO. : 12/571183
DATED : August 1, 2017
INVENTOR(S) : Kenneth A. Jenks Page 1 of 1

It is certified that error appears in the above-identified patent and said Letters Patent is hereby corrected as shown below:

In the Claims

Column 8, in Line 12 of Claim 1, replace the word "base" with "base where at least two surfaces of the base intersect"

Column 10, in Line 9 of Claim 17, replace the word "element" with "element where at least two surfaces of the receiving element intersect"

Signed and Sealed this
Nineteenth Day of December, 2017

Joseph Matal
*Performing the Functions and Duties of the
Under Secretary of Commerce for Intellectual Property and
Director of the United States Patent and Trademark Office*